(12) United States Patent
Ganusov et al.

(10) Patent No.: US 9,537,491 B1
(45) Date of Patent: Jan. 3, 2017

(54) LEAF-LEVEL GENERATION OF PHASE-SHIFTED CLOCKS USING PROGRAMMABLE CLOCK DELAYS

(71) Applicant: Xilinx, Inc., San Jose, CA (US)

(72) Inventors: Ilya K. Ganusov, San Jose, CA (US); Benjamin S. Devlin, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/667,580

(22) Filed: Mar. 24, 2015

(51) Int. Cl.
*H03L 7/06* (2006.01)
*H03L 7/08* (2006.01)

(52) U.S. Cl.
CPC ...................... *H03L 7/08* (2013.01)

(58) Field of Classification Search
CPC .... G06F 1/10; G06F 2217/84; G06F 17/5031; G06F 17/5045; G06F 1/189; G06F 1/04; G06F 1/12; G06F 13/1689; G06F 17/505; G06F 1/06; G06F 1/105; G06F 1/26; G06F 2217/62
USPC .......................... 327/141, 143, 144, 147, 149, 153,327/156–158, 161, 172, 175, 176, 291,327/295–297; 716/113, 134
See application file for complete search history.

(56) References Cited

U.S. PATENT DOCUMENTS

| | | | |
|---|---|---|---|
| 6,005,425 A | * | 12/1999 | Cho .................. H03L 7/093 327/156 |
| 7,759,973 B1 | | 7/2010 | Vadi et al. |
| 8,058,905 B1 | | 11/2011 | Klein et al. |
| 8,988,125 B1 | | 3/2015 | Ganusov et al. |
| 9,118,310 B1 | | 8/2015 | Ganusov et al. |
| 2009/0174455 A1 | * | 7/2009 | Dimitriu ............ G06F 13/4072 327/295 |
| 2015/0207617 A1 | * | 7/2015 | Usuda .................. H03L 7/08 375/376 |

OTHER PUBLICATIONS

Xilinx, Inc. "UltraScale Architecture Clocking Resources: Advance Specification User Guilde," v1.1, Aug. 21, 2014, San Jose, CA USA.

* cited by examiner

*Primary Examiner* — Lincoln Donovan
*Assistant Examiner* — Diana J Cheng
(74) *Attorney, Agent, or Firm* — Keith Taboada; Robert M. Brush; Steven Roberts (57) ABSTRACT

Methods and apparatus for generating multiple phase-shifted clock signals from a base clock signal using programmable delays at the leaf level in a clock distribution network are described. One example method for generating and distributing multiple phase-shifted clock signals in a programmable integrated circuit (IC) generally includes generating a base clock signal, routing the base clock signal through a clock distribution network in the programmable IC to a leaf node, and applying one or more programmable delays to the base clock signal received from the leaf node to generate the multiple phase-shifted clock signals.

19 Claims, 7 Drawing Sheets

LEAF-LEVEL GENERATION OF PHASE-SHIFTED CLOCKS USING PROGRAMMABLE CLOCK DELAYS

TECHNICAL FIELD

Examples of the present disclosure generally relate to clock distribution in integrated circuits (ICs) and, more particularly, to leaf-level generation of multiple phase-shifted clock signals.

BACKGROUND

Integrated circuits (ICs) may be implemented to perform specified functions. One type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application specific integrated circuits (ASICs).

These and other types of programmable ICs typically use a clock distribution network, or "clock tree," for distributing various clock signals throughout the IC. Some of the major considerations in designing a dock distribution network are skew, jitter, delay, duty cycle distortion, and power consumption. Various clock distribution topologies have been used in programmable ICs with various tradeoffs between these considerations.

SUMMARY

Examples of the present disclosure generally relate to generating multiple phase-shifted clock signals from a base clock signal using programmable delays at the leaf level in a clock distribution network.

One example of the present disclosure is a method for generating and distributing multiple phase-shifted clock signals in a programmable integrated circuit (IC). The method generally includes generating a base clock signal, routing the base clock signal through a clock distribution network in the programmable IC to a leaf node, and applying one or more programmable delays to the base clock signal received from the leaf node to generate the multiple phase-shifted clock signals.

Another example of the present disclosure is a programmable IC. The programmable IC generally includes a clock generation circuit configured to generate a base clock signal; a clock distribution network coupled to the clock generation circuit and configured to route the base clock signal to a leaf node; and one or more programmable delay elements coupled to the leaf node and configured to apply one or more programmable delays to the base clock signal received from the leaf node to generate a plurality of phase-shifted clock signals.

Yet another example of the present disclosure is a dock distribution network in an integrated circuit. The clock distribution network generally includes a base clock signal line configured to provide a base clock signal; one or more branches coupled to the base clock signal line for distributing the base clock signal to one or more leaf nodes; and one or more programmable delay elements coupled to at least one of the leaf nodes and configured to apply one or more programmable delays to the base clock signal received from the at least one of the leaf nodes to generate a plurality of phase-shifted clock signals.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide techniques and apparatus for generating multiple phase-shifted clock signals from a base clock signal using programmable delays at the leaf level in a clock distribution network for a programmable integrated circuit (IC). As used herein, the "leaf level" generally refers to a level of distribution in a clock network or "tree" in which a base clock signal (the trunk of the clock tree) has been routed via the trunk and the branches of the clock tree and is being split into multiple clock signals for local distribution (i.e., at the leaves of the clock tree).

Example Programmable Device Architecture

Figure 1A:
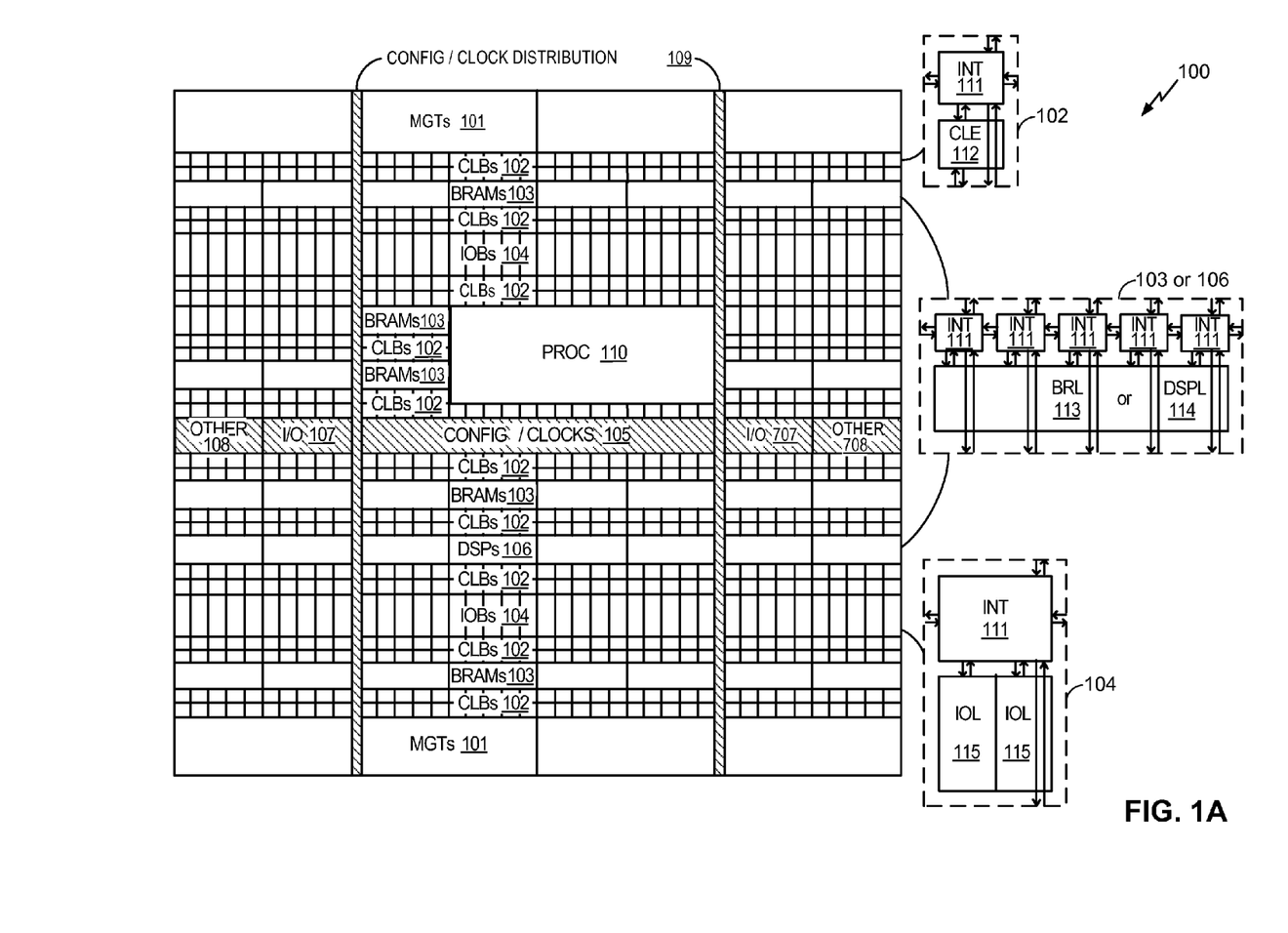
FIGS. 1A-1C are block diagrams illustrating example architectures for a programmable device, in accordance with an example of the present disclosure.

FIG. 1A is a block diagram illustrating an example architecture 100 for a programmable device, in accordance with an example of the present disclosure. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1A.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1A, a horizontal area near the center of the die (shown shaded in FIG. 1A) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1A include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1A that are external to the PROC 110 may be considered part of the, or the, programmable circuitry of the FPGA.

FIG. 1A is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1A are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Figure 1B:
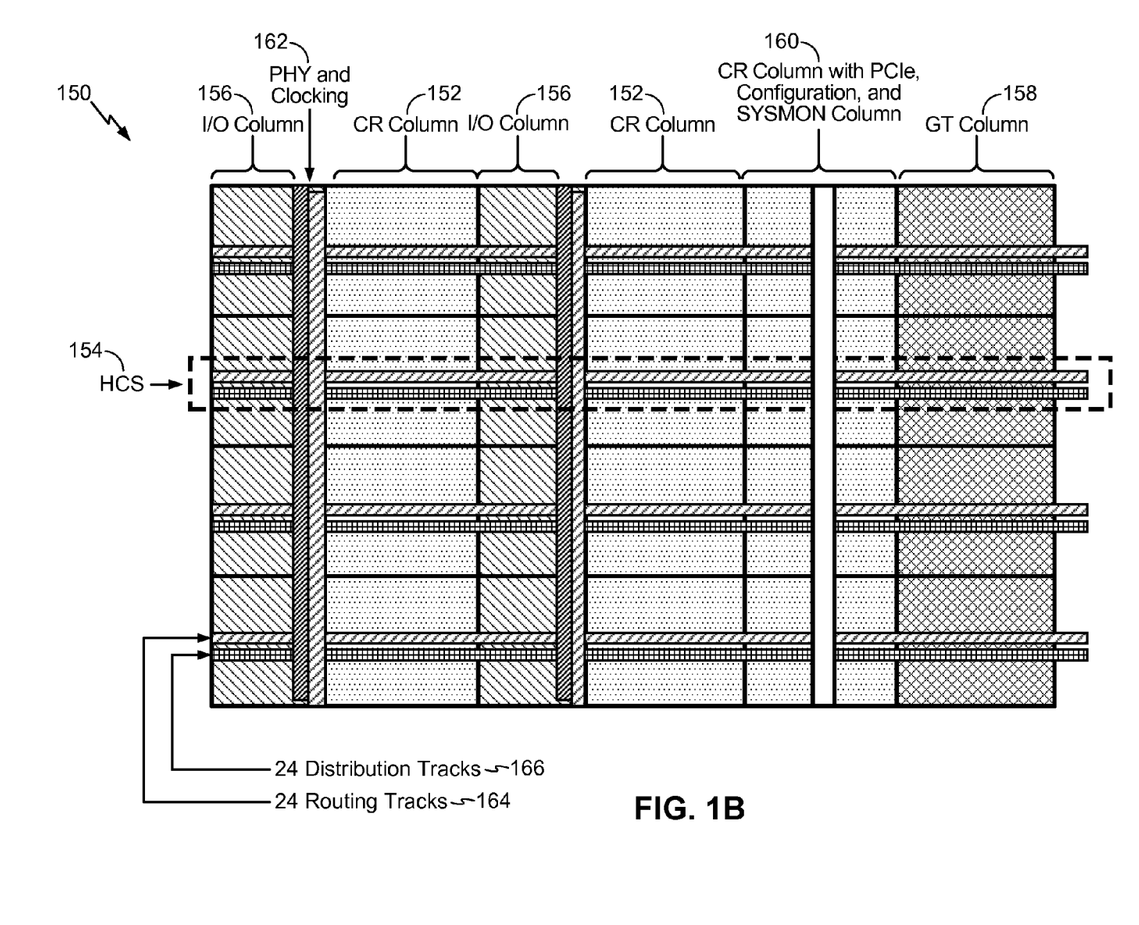

FIG. 1B is a block diagram illustrating another example architecture 150 for a programmable device, in accordance with an example of the present disclosure. The architecture 150 may be implemented within an FPGA, for example. In this architecture 150, the clocking resources may manage complex and simple clocking demands with dedicated global clocks distributed on clock routing and clock distribution resources. Clock management tiles (CMTs) may provide clock frequency synthesis, deskew, and jitter filtering functionality.

In FIG. 1B, the programmable device may be subdivided into columns and rows of segmented clock regions (CRs) 152. The CRs 152 differ from other architectures, such as the architecture 100 of FIG. 1A, because the CRs 152 may be arranged in tiles and may not span half the width of a device. A CR 152 may contain CLBs, DSP slices, block RAMs, interconnect, and associated clocking. For example, the height of a CR 152 may be 60 CLBs, 24 DSP slices, and 12 block RAMs with a horizontal dock spine (HCS) 154 at the center of the CR. The HCS 154 may contain the horizontal routing and distribution resources, leaf clock buffers, clock network interconnections, and the root of the clock network. Clock buffers may drive directly into the HCS 154. There may be 52 I/Os 156 per bank and four Gigabit transceivers (GTs) 158 that are pitch matched to the CRs 152. A core column 160 contains configuration, System Monitor (SYSMON), and PCIe® blocks to complete a basic device.

Figure 1C:
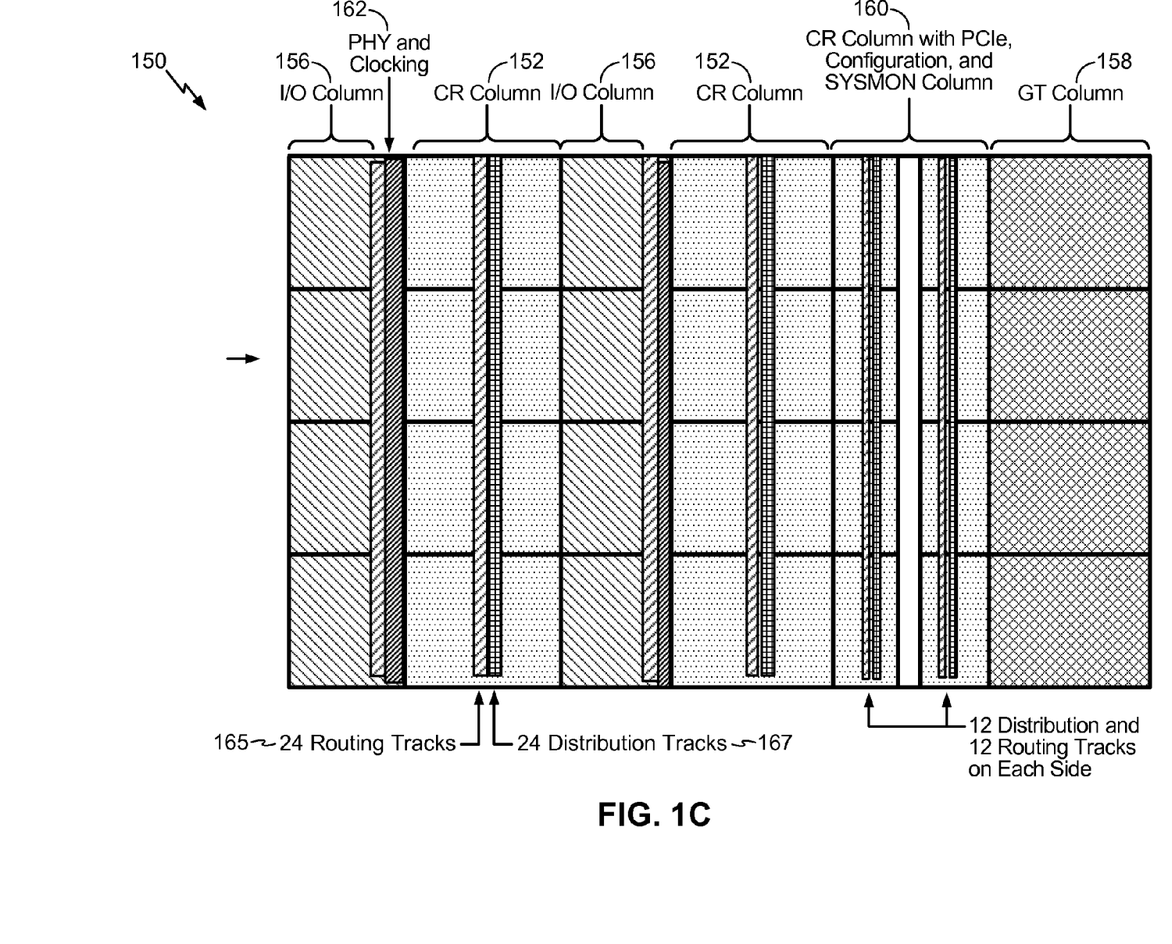

Adjacent to the input/output block columns 156 are the physical layer (PHY) blocks 162 with CMTs, global clock buffers, global clock multiplexing structures, and I/O logic management functions. The clocking drives vertical and horizontal connectivity through separate clock routing and clock distribution resources via the HCS 154 into the CRs 152 and I/Os 156. Horizontal clock routing and distribution tracks 164, 166 may drive horizontally into the CRs 152. As illustrated in FIG. 1C, vertical routing and distribution tracks 165, 167 may drive vertically adjacent CRs 152. The tracks 164-167 may be segmentable at the CR boundaries in both the horizontal and vertical directions. This allows for the creation of device-wide global clocks or local clocks of variable size. The distribution tracks 166, 167 may drive the clocking of synchronous elements across the device. The distribution tracks 166, 167 may be driven by routing tracks 164, 165 or directly by the clocking structures in the PHY 162. The I/Os 156 may be directly driven from the PHY clocking and/or an adjacent PHY via the routing tracks 164, 165.

A CMT may contain one mixed-mode clock manager (MMCM) and two phase-locked loops (PLLs). The MMCM is the primary block for frequency synthesis for a wide range of frequencies, may serve as a jitter filter for either external or internal clocks, and may deskew clocks among a wide range of other functions. The PLL's primary purpose is to provide clocking to the PHY I/Os, but may also be used for clocking other resources in the device in a limited fashion. The device clock input connectivity allows multiple resources to provide the reference clock(s) to the MMCM and PLL.

As described above, the architecture 150 in FIGS. 1B and 1C is composed of blocks of CRs 152. The CRs 152 may be organized in a tile fashion and thus build columns and rows. Each CR 152 may contain slices (CLBs), DSPs, and block RAM blocks. The mix of slice, DSP, and block RAM columns in each CR 152 can be different, but are typically identical when stacked in the vertical direction in an effort to build columns of those resources for the entire programmable device. I/O and GT columns 156, 158 may be inserted with columns of CRs 152. In addition, there may be a single column 160 that contains the configuration logic, SYSMON, and PCIe blocks. An HCS 154 runs horizontally through the device in the center of each row of CRs, I/Os, and GTs. The HCS 154 contains the horizontal routing and distribution tracks 164, 166 as well as leaf clock buffers and clock network interconnects between horizontal/vertical routing and distribution. Vertical tracks 165, 167 of routing and distribution may connect all CRs 152 in a column, and vertical routing may span an entire I/O column 156. There may be 24 horizontal routing tracks 164, 24 horizontal distribution tracks 166, 24 vertical routing tracks 165, and 24 vertical distribution tracks 167 as shown in FIGS. 1B and 1C.

Figure 2:
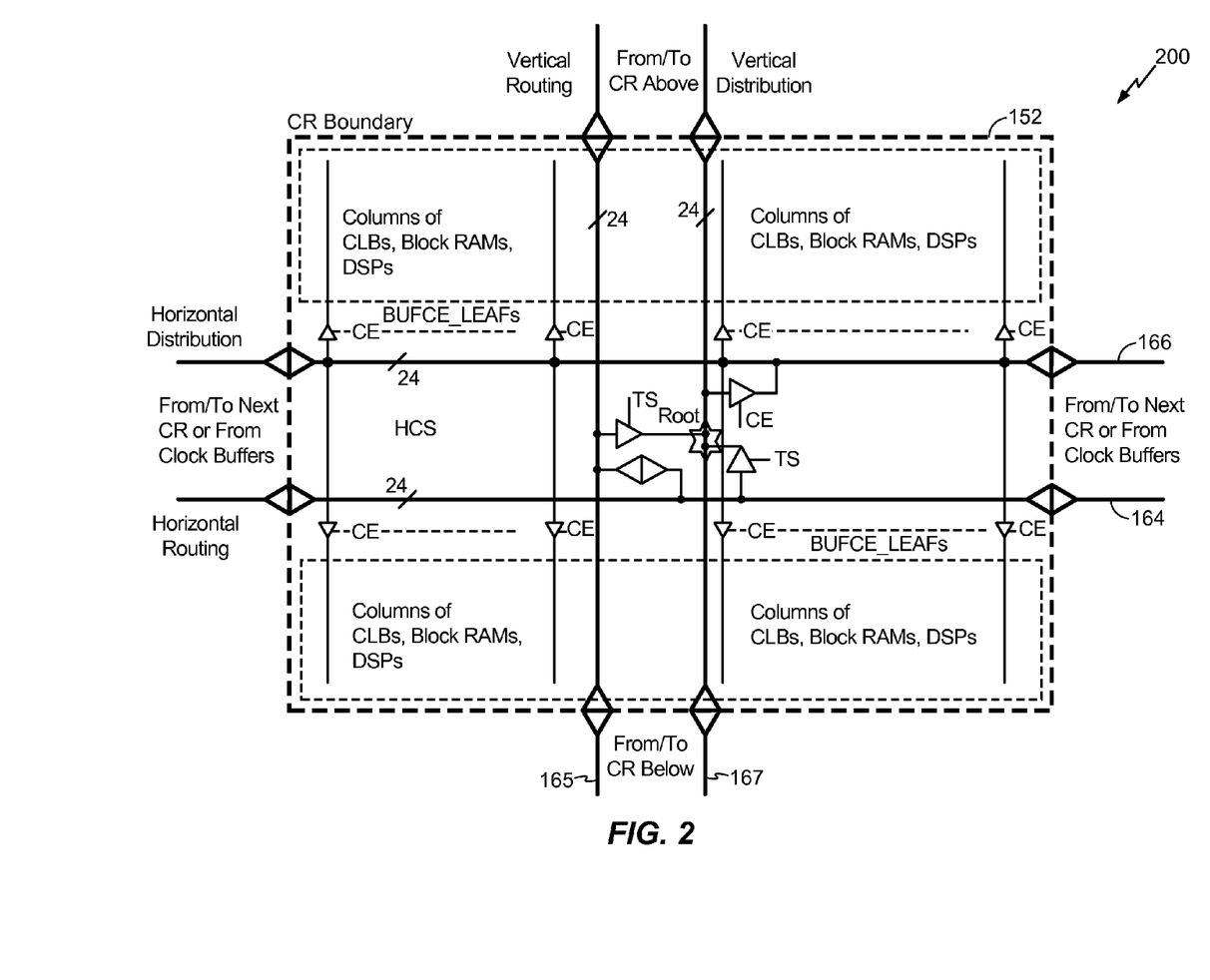
FIG. 2 illustrates example clock distribution for the programmable device architecture of FIG. 1B, in accordance with an example of the present disclosure.

As illustrated in the block diagram 200 of FIG. 2, the clocks may be distributed from their sources in one of two ways. The clocks may go onto routing tracks 164, 165 that take the clocks to a central point in a CR 152 without going to any loads. The clocks may then drive the distribution tracks 166, 167 unidirectionally from which the clock networks fan out. In this way, the clock buffers may drive to a specific point in the CRs 152 from which the clock buffers travel vertically and then horizontally on the distribution tracks to drive the clocking points. The clocking points may be driven via leaf clocks with clock enable (CE) in that CR and adjacent CRs, if desired. Distribution tracks 166, 167 may not drive routing tracks 164, 165.

Such a distribution scheme is used to move the root for all the loads to be at a specific location for improved, localized skew. Furthermore, both routing and distribution tracks may drive into horizontally or vertically adjacent CRs in a segmented fashion. Routing tracks 164, 165 may drive both routing and distribution tracks in the adjacent CRs 152, while the distribution tracks may drive other horizontal distribution tracks 166 in adjacent CRs. The CR boundary segmentation allows construction of either truly global, device-wide clock networks or more local clock networks of variable sizes by reusing clocking tracks. Alternatively, clock buffers may drive straight onto the distribution tracks 166, 167 and distribute the clock in that manner. This reduces the clock insertion delay.

As described below, multiple phase-shifted clock signals may be generated from a global clock signal at the leaf level in the clock distribution network of FIGS. 1B and 1C.

Example Leaf-Level Generation of Phase-Shifted Clocks

Figure 3A:
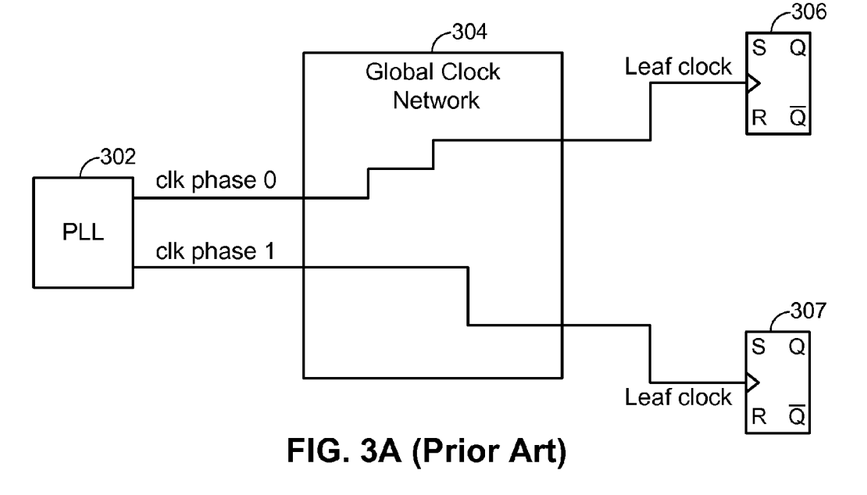
FIG. 3A is a block diagram illustrating conventional clock routing using a phase-locked loop (PLL) to generate multiple phase-shifted clocks.

Currently, out-of-phase clock signals are generated by phase-locked loops (PLLs) in the clock management tile (CMT) and are then distributed over the clock distribution and clock routing networks to the source and/or destination flip-flops. For example, FIG. 3A shows this conventional way of generating and distributing phase-shifted versions of the clocks with the same base frequency. Two clocks having different phases (labeled "clk phase 0" and "clk phase 1") are generated by a PLL 302 (or a delay-locked loop (DLL)). The two out-of-phase clocks are routed separately though a global clock network 304. The global clock network 304 may comprise routing and distribution tracks 164-167 in the architecture 150 described above. Once the phase-shifted clocks reach the correct column in a flexible subregion (FSR) (e.g., a CR 152), the clocks transition to vertical leaf dock tracks, which transfer signals to the desired flip-flops 306, 307 in the logic slices.

A large disadvantage to this approach for generating phase-shifted clocks is that clock phase shift introduced at the source PLL 302 will be affected by source-destination random variations in the global clock network 304, meaning the nominal phase shift at the PLL 302 may most likely not remain at the flip-flops 306, 307. This phenomenon becomes worse with greater source-to-destination distance. To account for this timing analysis introduces a larger minimum/maximum spread to the source and/or destination flip-flops 306, 307, worsening performance and potentially introducing setup and hold violations.

Examples of the present disclosure generate multiple phase-shifted clock signals from a global clock signal using programmable delays at the leaf level in a clock distribution network. By cascading multiple leaf clock programmable delays, sufficiently large delays (e.g., 0 to 1 ns in 50 ps increments) may be generated, which may be used to phase shift a clock signal at the leaf level, after distribution through the global clock network. This approach moves the clock generation from the PLL 302 to much closer to the source and/or destination flip-flops that use these out-of-phase clock signals.

Figure 3B:
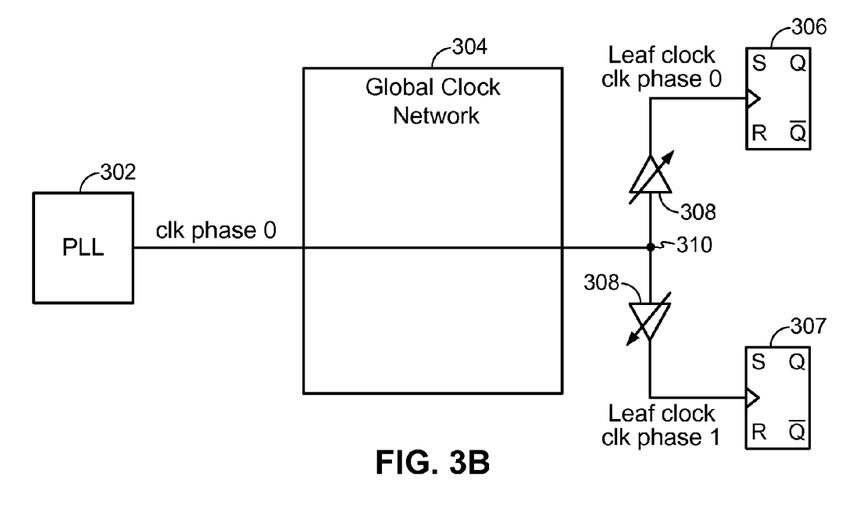
FIG. 3B is a block diagram illustrating example clock routing and leaf-level generation of multiple phase-shifted clocks using one or more programmable clock delays, in accordance with an example of the present disclosure.

FIG. 3B is a block diagram illustrating example clock routing and leaf-level generation of multiple phase-shifted clocks using one or more programmable leaf clock delays, in accordance with an example of the present disclosure. Instead of generating and routing two clock phases from the PLL 302 as in FIG. 3A, a single base clock (labeled "clk phase 0") is generated and routed to a leaf clock node 310 via the global clock network 304. From the leaf clock node 310, an individual leaf clock may be routed at the leaf clock level and delayed by a programmable delay element 308 (e.g., a programmable delay line) to generate a phase-shifted clock, or the programmable delay element can be bypassed to generate a clock without phase shift (i.e., in phase with the base clock), or delayed in a programmable delay element to generate a phase-shifted clock. For some examples, multiple delay circuits that are otherwise unused may be combined to create delayed (phase-shifted) versions of the single base clock.

Although not shown in FIG. 3B, more than two phase-shifted clocks may be generated from a single base clock. For example, up to 16 phase-shifted clocks may be generated from a single base clock using different programmable delays. As another example, phase shifts ranging from 0 to 1 ns in 50 ps increments may be applied at the leaf clock level to provide at least 16 uniquely phase-shifted clocks. For some examples, the phase shifts may range from 0 up to 10 ns, and the phase shift increment may be around 30 ps. For some examples, if more phase-shifted clock signals are desired, another base clock may be generated by the PLL 302 and routed through the global clock network 304 to a different FSR for creating another set of leaf-level generated phase-shifted clocks.

There are several advantages offered by leaf-level generation of phase-shifted clocks including less jitter and unwanted skew between clock phases, less power consumption on the clock network, and lower consumption of clock routing tracks. As described above with respect to FIG. 3A, one conventional approach generates phase-shifted clocks from a single clock using a PLL 302 and then distributes these phase-shifted clocks to the source and/or destination via the clock routing and distribution networks. Because the common node for these two clocks will be the PLL 302 when calculating clock delay from common node to source or destination flip-flops 306, 307, the minimum and maximum of both paths from the clock root (the PLL) should be taken into account. This can add hundreds of picoseconds of potentially unwanted skew between the generated clocks, becoming larger with distance. With examples of the present disclosure, the common node has been moved to the leaf clock and so common node pessimism removal (CPR) permits removing all unwanted skew that is present due to min-max variation in the clock routing and distribution networks. Even if the source and destination are not in the same leaf clock column, CPR may still be used to remove unwanted skew to the closest common node in the clock distribution network, no matter the distance from the clock generation source to the destination point.

Because examples of the present disclosure move the clock generation to the leaf clock level, multiple phase-shifted clocks need not be distributed across the clock routing and distribution networks. Depending on the distance from the PLL 302 to the clock source or destination, this can be many millimeters of wire and tens of buffers and multiplexers through which the signal has to travel. Moreover, the out-of-phase clock generation is moved to the leaf level, such that a single original phase clock signal may be routed via and consume a single clock distribution and routing track 164-167. The advantages of this approach increase as more out-of-phase signals are desired, as at a single leaf clock column up to 16 unique phases, for example, may be generated using only one dock distribution and routing.

Example High-Speed Serial Link Transceiver Circuit Using Phase-Shifted Clocks

Figure 4:
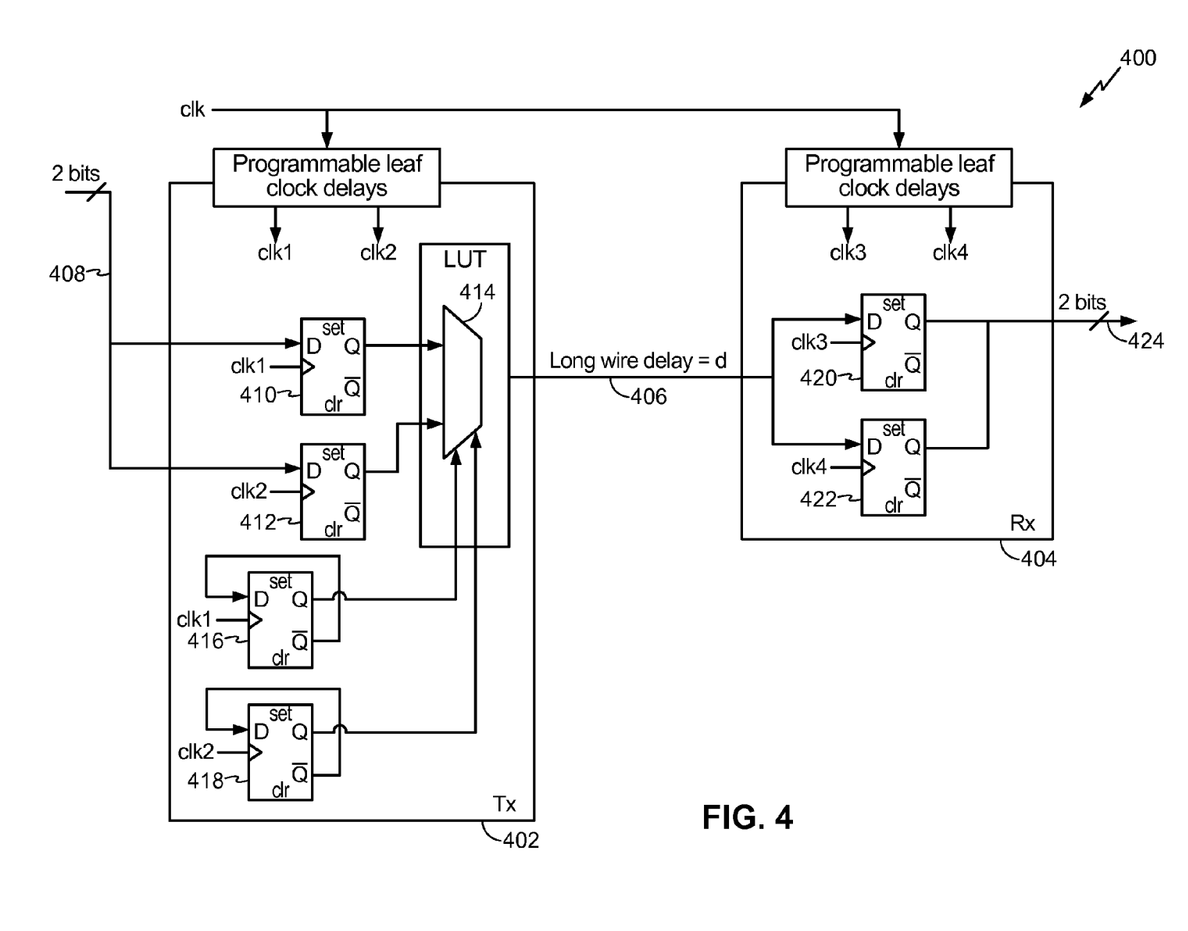
FIG. 4 is a block diagram illustrating an example programmable high-speed serial link communication circuit using multiple phase-shifted clocks generated at the leaf level, in accordance with an example of the present disclosure.

FIG. 4 is a block diagram illustrating an example serializer/deserializer (SerDes)-like communication circuit 400 using multiple phase-shifted docks generated at the leaf level as in FIG. 3B, in accordance with an example of the present disclosure. Typically used in wire-limited or high-speed communications, a SerDes converts parallel data into serial data for transmission across a single line (or pair of differential lines) in an effort to reduce the number of I/O pins and interconnects.

The circuit 400 consists of a transmitter (TX) circuit 402 and a receiver (RX) circuit 404 connected by a wire 406, for example. The TX circuit 402 receives a 2-bit input signal 408, serializes the two bits, and sends them over the wire 406 to the RX circuit 404. More than 2 bits may be serialized by using a larger number of phase-shifted clocks. The TX circuit 402 uses phase-shifted versions (clk1 and clk2) of the original clk to control serialization. The two phase-shifted clocks may be generated at the leaf level, as described above. The two upper flip-flops 410, 412 propagate the 2 bits of data to a multiplexer (MUX) 414, and the two lower flip-flops 416, 418 switch the control inputs to the MUX 414 between propagating bit 1 and bit 0. On the positive edge of clk1, the control input switches the MUX 414 to propagate bit 0 onto the wire 406. On the positive edge of phase-shifted clk2 (having a different phase than clk1), the flip-flop 418 switches control to propagate bit 1 onto the wire 406. On the next positive edge of clk1, the control input switches the MUX 414 back to propagating bit 0 and so on.

The RX circuit 404 deserializes the signal received via the wire 406 into a parallel output 424 by using phase-shifted flip-flops 420, 422 controlled by additional leaf-level generated phase-shifted clocks (clk3 and clk4). The phase shift of clk3 and clk4 is dictated by the propagation delay (d) through the wire 406 and the phase shift between the clocks (clk1 and clk2) used to serialize the data.

Example Operations for Generating Phase-Shifted Clocks

Figure 5:
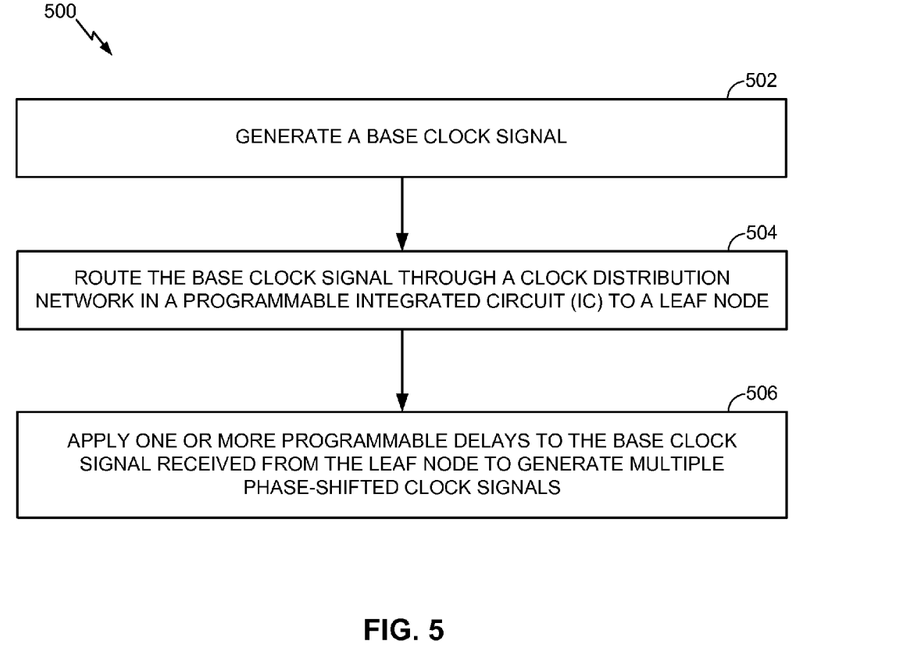
FIG. 5 is a flow diagram of example operations for generating and distributing multiple phase-shifted clock signals in a programmable integrated circuit (IC), in accordance with an example of the present disclosure.

FIG. 5 is a flow diagram of example operations 500 for generating and distributing multiple phase-shifted clock signals in a programmable IC, in accordance with an example of the present disclosure. The operations 500 may be performed, for example, by a programmable IC, such as an FPGA implementing the architecture 150 of FIGS. 1B and 1C.

The operations 500 may begin, at block 502, with the programmable IC generating a base clock signal (e.g., the global clock signal). For some examples, the programmable IC generates the base clock signal from a phase-locked loop (PLL) or a delay-locked loop (DLL) in the programmable IC. At block 504, the programmable IC routes the base clock signal through a clock distribution network to a leaf node.

At block 506, the programmable IC applies one or more programmable delays to the base clock signal received from the leaf node to generate the multiple phase-shifted clock signals. Each of the multiple phase-shifted clock signals may have a unique phase shift (with respect to any other phase-shifted clock signal). For example, up to 16 phase-shifted clock signals may be generated from a single base clock signal, and each of the 16 phase-shifted clock signals may have a unique phase shift. According to some examples, applying the one or more programmable delays involves using one or more programmable delay elements coupled to the leaf node.

According to some examples, the leaf node is a common node for the multiple phase-shifted clock signals, and the unwanted skew between two of the multiple phase-shifted clock signals originates from the common node.

According to some examples, the operations 500 further involve the programmable IC applying no delay (or substantially zero delay) to the base clock signal received from the leaf node to generate one of the multiple phase-shifted clock signals. For some examples, applying no delay entails bypassing a programmable delay element such that the one of the multiple phase-shifted clock signals is in phase with the base clock signal.

As used herein (including the claims that follow), a phrase referring to "at least one of" a list of items refers to any combination of those items, including single members. As an example, "at least one of: a, b, and c" is intended to cover: a, b, c, a-b, a-c, b-c, a-b-c, and any combination thereof (e.g., a-b-b and a-a-b-c).

While the foregoing is directed to examples of the present disclosure, other and further examples of the disclosure may be devised without departing from the basic scope thereof, and the scope thereof is determined by the claims that follow.

What is claimed is:

1. A method for generating and distributing multiple phase-shifted clock signals in a programmable integrated circuit (IC), comprising:
   generating a base clock signal in the programmable IC;
   routing the base clock signal through a clock distribution network in the programmable IC to a leaf node, wherein the programmable IC comprises a field-programmable gate array (FPGA); and
   applying one or more programmable delays to the base clock signal received from the leaf node to generate the multiple phase-shifted clock signals.

2. The method of claim 1, wherein applying the one or more programmable delays comprises using one or more programmable delay elements coupled to the leaf node.

3. The method of claim 1, wherein each of the multiple phase-shifted clock signals has a unique phase shift.

4. The method of claim 1, wherein the leaf node is a common node for the multiple phase-shifted clock signals and wherein unwanted skew between two of the multiple phase-shifted clock signals originates from the common node.

5. The method of claim 1, further comprising applying no delay to the base clock signal received from the leaf node to generate one of the multiple phase-shifted clock signals.

6. The method of claim 5, wherein applying no delay comprises bypassing a programmable delay element and wherein the one of the multiple phase-shifted clock signals is in phase with the base clock signal.

7. The method of claim 1, wherein generating the base clock signal comprises generating the base clock signal from a phase-locked loop (PLL) or a delay-locked loop (DLL) in the programmable IC.

8. The method of claim 1, wherein the multiple phase-shifted clock signals comprise up to 16 phase-shifted clock signals generated from the base clock signal, each of the 16 phase-shifted clock signals having a unique phase shift.

9. The method of claim 1, further comprising clocking one or more clocked elements in each of a plurality of configurable logic blocks in the programmable IC using the multiple phase-shifted clock signals.

10. A programmable integrated circuit (IC) comprising:
    a clock generation circuit configured to generate a base clock signal;
    a clock distribution network coupled to the clock generation circuit and configured to route the base clock signal through the programmable IC to a leaf node, wherein the programmable IC comprises a field-programmable gate array (FPGA); and
    one or more programmable delay elements coupled to the leaf node and configured to apply one or more programmable delays to the base clock signal received from the leaf node to generate a plurality of phase-shifted clock signals.

11. The programmable IC of claim 10, wherein each of the phase-shifted clock signals has a unique phase shift.

12. The programmable IC of claim 10, wherein the leaf node is a common node for the plurality of phase-shifted clock signals and wherein unwanted skew between two of the phase-shifted clock signals originates from the common node.

13. The programmable IC of claim 10, wherein no delay is applied to the base clock signal received from the leaf node to generate one of the phase-shifted clock signals and wherein the one of the phase-shifted clock signals is in phase with the base clock signal.

14. The programmable IC of claim 13, wherein one of the programmable delay elements is bypassed to generate the one of the phase-shifted clock signals that is in phase with the base clock signal.

15. The programmable IC of claim 10, wherein the clock generation circuit comprises a phase-locked loop (PLL) or a delay-locked loop (DLL) configured to generate the base clock signal.

16. The programmable IC of claim 10, wherein the plurality of phase-shifted clock signals comprise up to 16 phase-shifted clock signals generated from the base clock signal, each of the 16 phase-shifted clock signals having a unique phase shift.

17. The programmable IC of claim 10, further comprising a plurality of configurable elements each comprising one or more clocked elements coupled to at least one of the phase-shifted clock signals.

18. The programmable IC of claim 10, further comprising:
    a transmit circuit clocked by a first set of the phase-shifted clock signals and configured to serialize a parallel input to the transmit circuit; and
    a receive circuit clocked by a second set of the phase-shifted clock signals and configured to deserialize the serialized input received from the transmit circuit.

19. The programmable IC of claim 18, wherein the first and second sets of the phase-shifted clock signals are mutually exclusive.

* * * * *